(12) United States Patent
Lin

(10) Patent No.: US 8,076,585 B2
(45) Date of Patent: Dec. 13, 2011

(54) PRINTED CIRCUIT BOARD

(75) Inventor: Yu-Hsu Lin, San Jose, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 572 days.

(21) Appl. No.: 12/251,397

(22) Filed: Oct. 14, 2008

(65) Prior Publication Data

US 2009/0294152 A1 Dec. 3, 2009

(30) Foreign Application Priority Data

May 27, 2008 (CN) .......................... 2008 1 0301797

(51) Int. Cl.
*H05K 1/00* (2006.01)

(52) U.S. Cl. ........ 174/250; 174/261; 361/800; 361/816; 361/818

(58) Field of Classification Search ............. 361/777, 361/794, 800, 816, 818; 174/261, 250
See application file for complete search history.

(56) References Cited

U.S. PATENT DOCUMENTS

| 5,300,899 A * | 4/1994 | Suski ........................ 333/1 |
| 5,675,299 A * | 10/1997 | Suski ........................ 333/1 |
| 2006/0246268 A1* | 11/2006 | Honjo et al. ............... 428/209 |

* cited by examiner

Primary Examiner — Dameon Levi
Assistant Examiner — Hoa C Nguyen
(74) Attorney, Agent, or Firm — Altis Law Group, Inc.

(57) ABSTRACT

A printed circuit board includes a ground layer and a signal layer. The ground layer has a grid formed by grid lines. A pair of signal traces is laid on the signal layer. The pair of signal traces is symmetrical about one grid line or one central line of the grid.

5 Claims, 5 Drawing Sheets

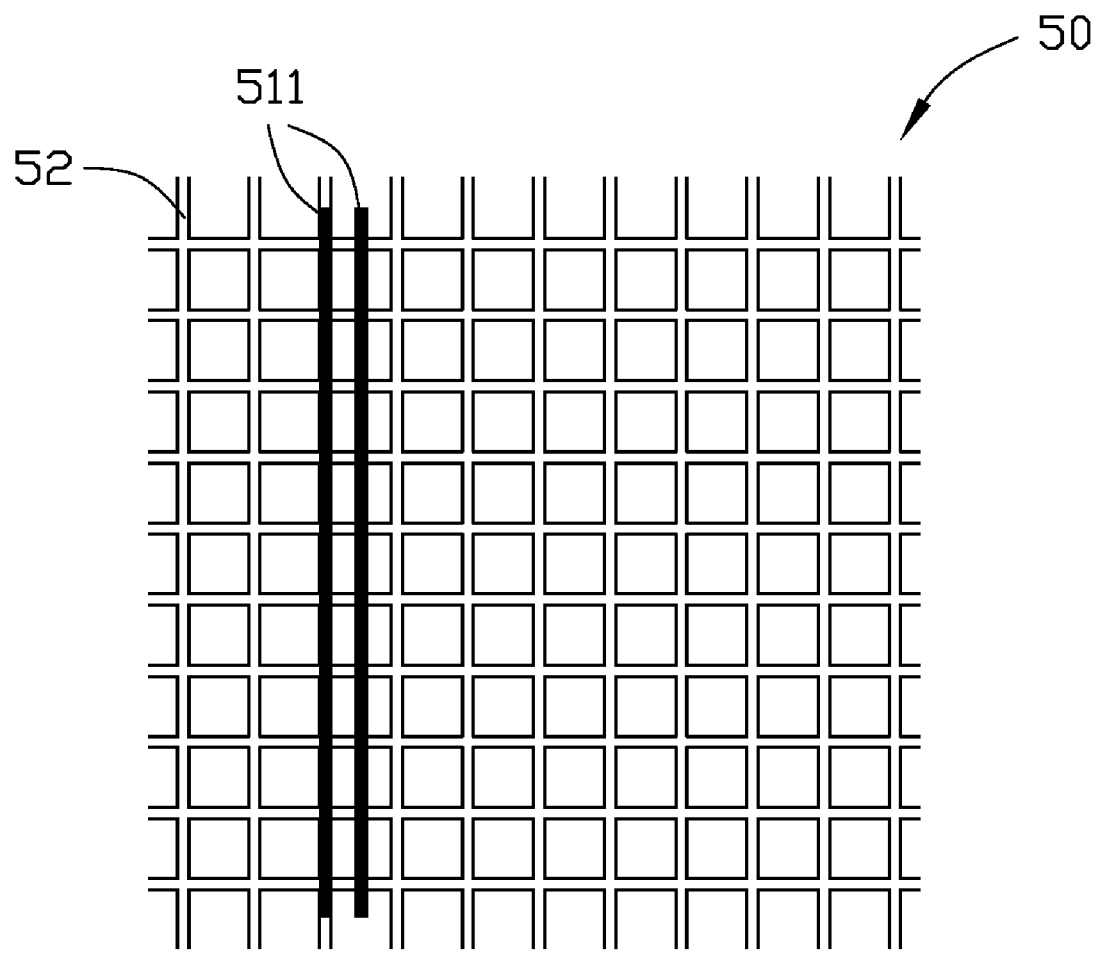
FIG. 5 <PRIOR ART>

PRINTED CIRCUIT BOARD

BACKGROUND

1. Technical Field

The present invention relates to a printed circuit board and particularly to a printed circuit board for transmitting high speed differential signals.

2. Description of Related Art

Flexible printed circuit boards (FPCs) are widely used in electronic devices for connecting different electronic elements of the electronic devices. The FPCs are made from flexible material, and have some advantages over conventional circuit boards. For example, the FPCs are very thin, and can be freely bent or folded to satisfy different layouts of the electronic elements of the electronic devices. Therefore, using FPCs to connect electronic elements can save space in the electronic device.

However, because FPCs are very thin, impedances of signal traces laid on the FPCs are very low, whereas high impedances will enable better performance in the transmission of high speed differential signals. For promoting the impedances of high speed differential signals, a conventional method is to etch a ground layer of the FPC into grids. In FIG. 5, a grid type ground layer 52 of an FPC 50 is shown. A pair of high speed differential signal traces 511 is laid on the FPC 50. When high speed differential signals are transmitted through the traces 511, common-mode noise is created, which affects the signal quality of the FPC.

Therefore, a new circuit board is desired to overcome the above-described deficiency.

BRIEF DESCRIPTION OF THE DRAWINGS

FIG. 5 is a schematic view of a typical printed circuit board.

DETAILED DESCRIPTION OF THE EMBODIMENTS

Figure 1:
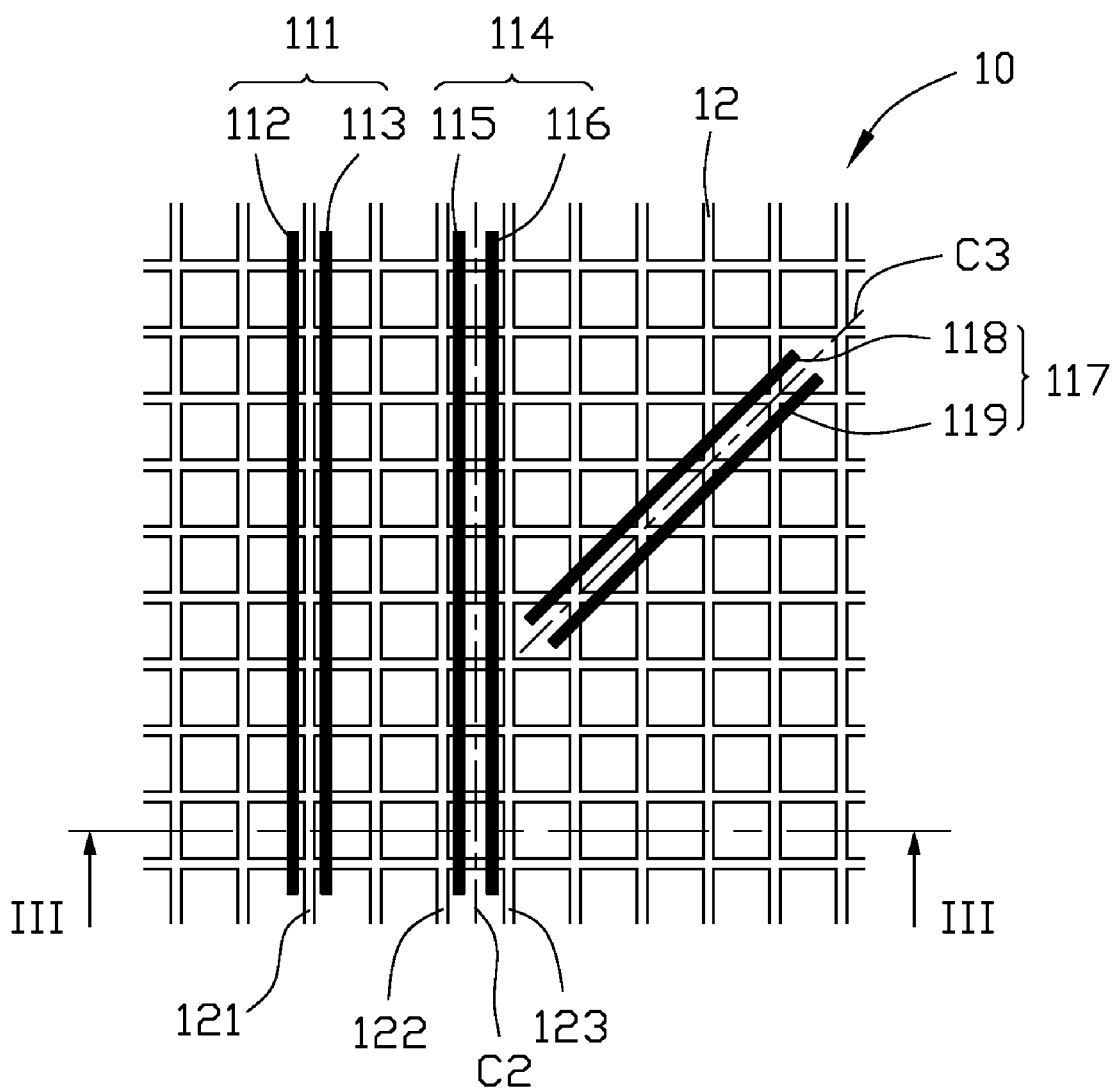
FIG. 1 is a schematic view of a first embodiment of a printed circuit board.
Figure 2:
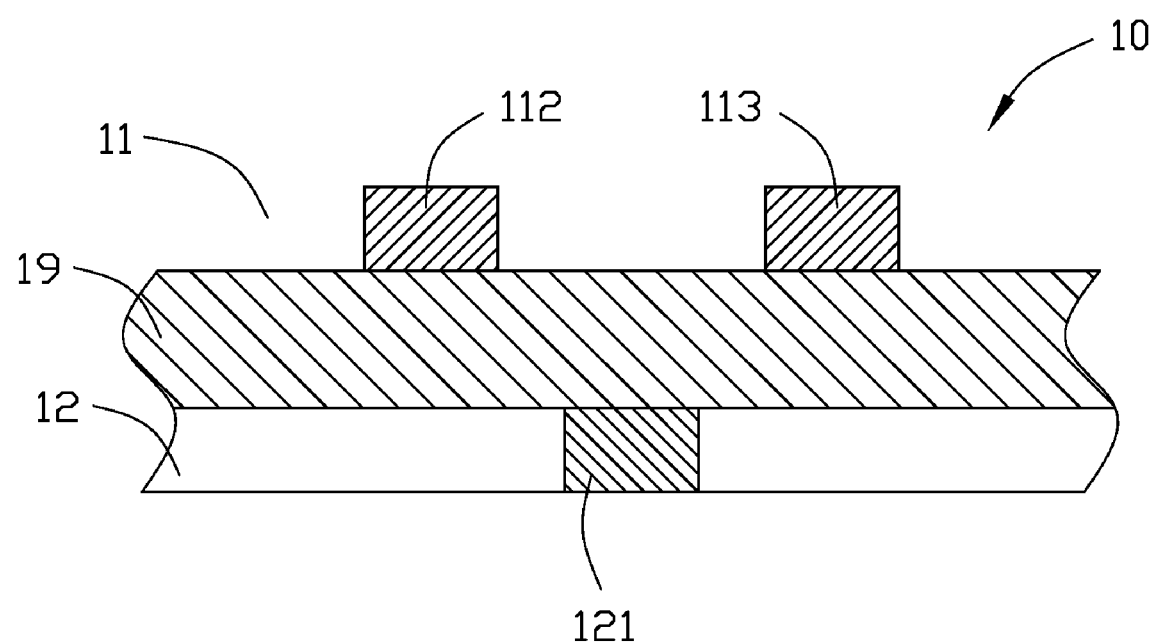
FIG. 2 is a cross sectional view of the printed circuit board of FIG. 1, taken along line II-II.

Referring to FIGS. 1 and 2, an embodiment of a printed circuit board 10 includes a signal layer 11, a ground layer 12, and an insulated layer 19 located between the signal layer 11 and the ground layer 12. The ground layer 12 is a copper plate etched to form a grid of square cells delineated by copper grid lines left by the etching. A first pair of high speed differential signal traces 111, a second pair of high speed differential signal traces 114, and a third pair of high speed differential signal traces 117 are laid on the signal layer 11.

The first pair of signal traces 111 includes two traces 112 and 113. The two traces 112 and 113 are symmetrically laid on opposite sides of and very near to a grid line 121. Since the traces 112, 113 are so near to one grid line and far from other grid lines, the influence of the other grid lines is minimal and can be ignored. The influence of the grid line 121 is uniform along the length of the traces 112 and 113, and generation of common noise between the traces 112 and 113 is minimized because the traces 112 and, 113 are symmetrically arranged about the grid line 121.

The second pair of signal traces 114 includes two traces 115 and 116. The two traces 115 and 116 are laid on opposite sides of a central line C2 of a square cell, which is bounded by grid lines 122 and 123. The two traces 115 and 116 are symmetrical about the central line C2. Since the traces 115, 116 are so near to the grid lines 122 and 123 and far from other grid lines, the influence of the other grid lines is minimal and can be ignored. The influence of the grid line is uniform along the length of the traces 115, 116 and generation of common noise between the traces 112, 113 is minimized because the traces 115 and 116 are symmetrically arranged about the central line C2.

The third pair of signal traces 117 includes two traces 118 and 119. The two traces 118 and 119 are laid on opposite sides of a diagonal line C3 of a square cell. The two traces 118 and 119 are symmetrical about the diagonal line C3. Since the grid lines adjacent to the two traces 118 and 119 are symmetrical about the diagonal line C3, only a small common-mode noise is generated when the traces 118 and 119 transmit high speed differential signals.

Figure 3:
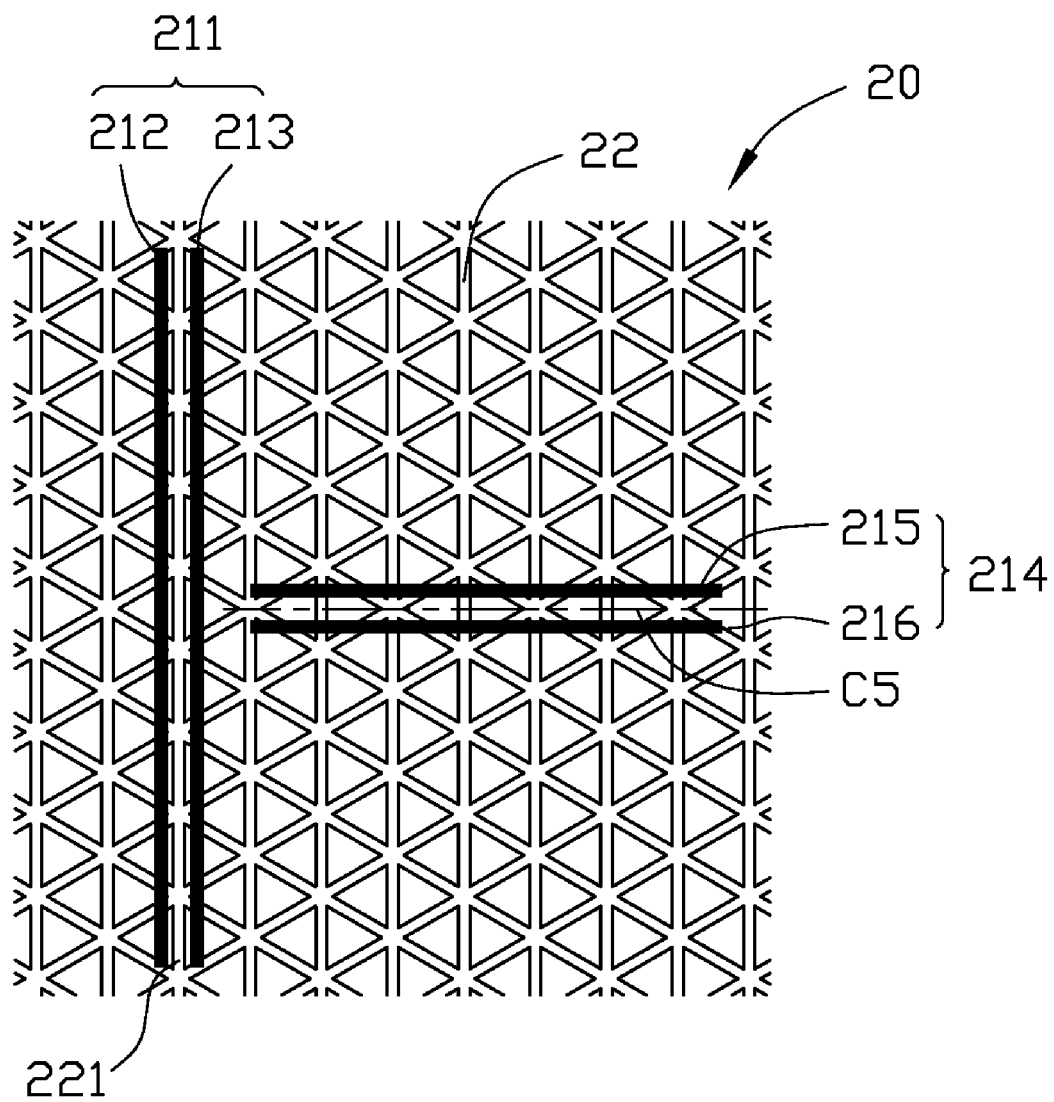
FIG. 3 is a schematic view of a second embodiment of a printed circuit board.

Referring to FIG. 3, a second embodiment of a printed circuit board 20 includes a ground layer 22 and a signal layer (not labeled). A first pair of high speed differential signal traces 211 and a second pair of high speed differential signal traces 214 are laid on the signal layer. The ground layer 22 is formed into a grid of triangular cells formed by vertical and oblique grid lines.

The first pair of signal traces 211 includes two traces 212 and 213. The two traces 212 and 213 are symmetrically laid on opposite sides of a grid line 221. Since the traces 212, 213 are so near to one grid line and far from other grid lines, the influence of the other grid lines is minimal and can be ignored. In addition, since the traces 212 and 213 are symmetrical about the gird line 221, only a small common-mode noise is generated when the traces 212 and 213 transmit high speed differential signals.

The second pair of signal traces 214 includes two traces 215 and 216. The two traces 215 and 216 are laid on opposite sides of a central line C5 of a triangular cell, and symmetrical about central line C5. Since the grid lines adjacent to the two traces 215 and 216, are symmetrical about the central line C5, only a small common-mode noise is generated when the traces 215 and 216 transmit high speed differential signals.

Figure 4:
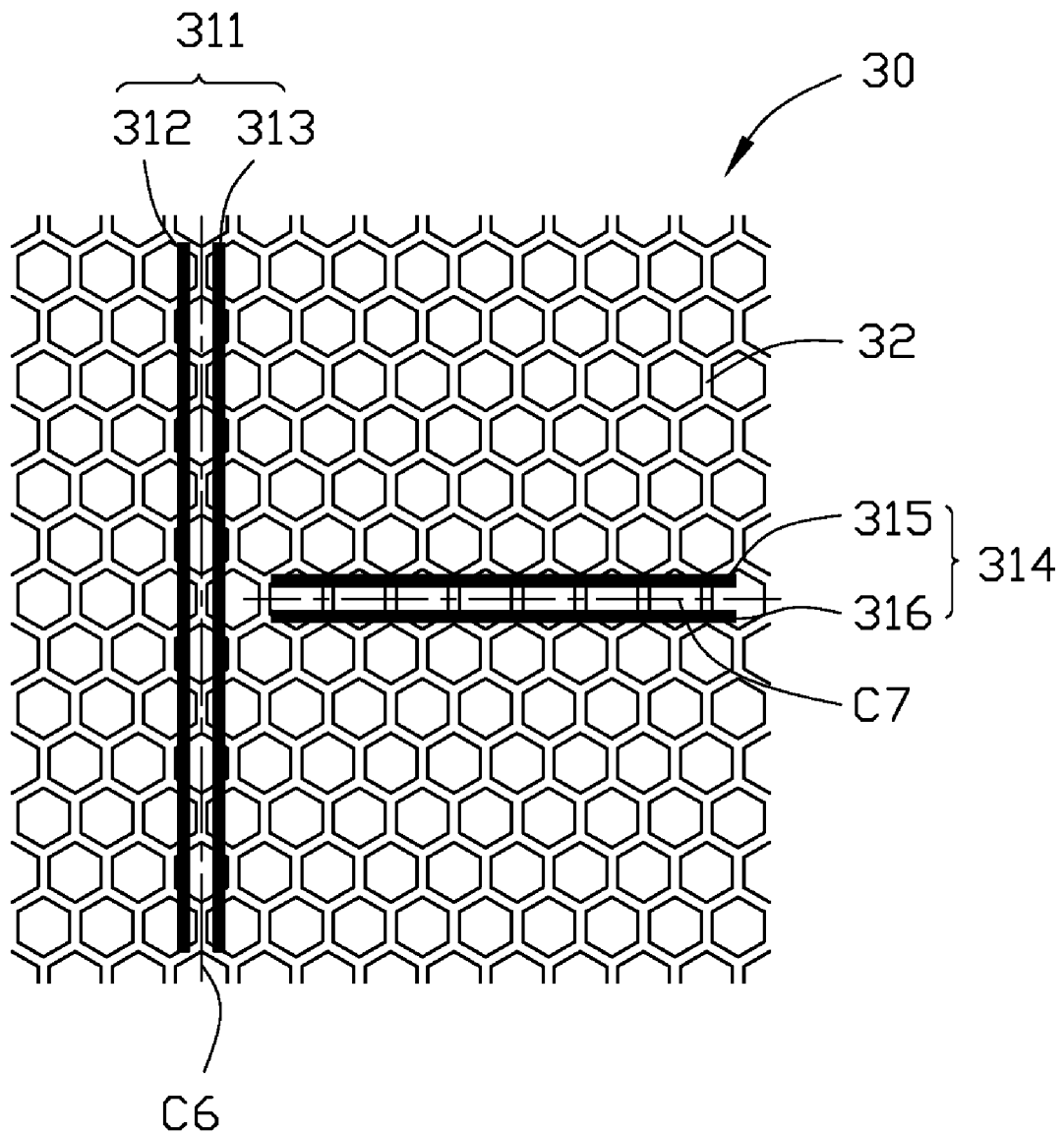
FIG. 4 is a schematic view of a third embodiment of a printed circuit board.

Referring to FIG. 4, a third embodiment of a printed circuit board 30 includes a ground layer 32 and a signal layer (not labeled). A first pair of high speed differential signal traces 311 and a second pair of high speed differential signal traces 314 are laid on the signal layer. The ground layer 32 is formed into a grid of hexagonal cells formed by grid lines.

The first pair of signal traces 311 includes two traces 312 and 313. The two traces 312 and 313 are symmetrically laid on opposite sides of a central line C6 of a hexagonal cell. The central line C6 passes through vertices of corresponding hexagonal cells of the corresponding grid and a corresponding grid line. Since the grid lines adjacent to the two traces 312 and 313 are symmetrical about the central line C6, only a small common-mode noise is generated when the traces 312 and 313 transmit high speed differential signals.

The second pair of signal traces 314 includes two traces 315 and 316. The two traces 315 and 316 are laid on opposite sides of a central line C7 of a hexagonal cell, and symmetrical about the central line C7. The central line C7 bisects corresponding hexagonal cells. Since the grid lines adjacent to the two traces 315 and 316 are symmetrical about the central line C7, only a small common-mode noise is generated when the traces 315 and 316 transmit high speed differential signals.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board comprising:
   a ground layer having a grid formed by grid lines; and
   a signal layer comprising a pair of signal traces laid on the signal layer, the pair of signal traces being symmetrical about one grid line; wherein the pair of signal traces is laid on opposite sides of the grid line, and each signal trace of the pair of signal traces is closer to the grid line than other grid lines.

2. The printed circuit board of claim 1, wherein the grid has a plurality of triangular cells, and the grid line is a line of one of the plurality of triangular cells.

3. The printed circuit board of claim 1, wherein the grid has a plurality of hexagonal cells, and the grid line is a line of one of the plurality of triangular cells.

4. A printed circuit board comprising:
   a ground layer having a grid formed by grid lines; and
   a signal layer comprising a pair of signal traces laid on the signal layer, the pair of signal traces being adjacent to a plurality of grid lines, and influence of the plurality of grid lines being uniform along the length of the pair of signal traces;
   wherein the grid has a plurality of square cells, the pair of signal traces is symmetrical about a central line of one common square cell of the plurality of square cells, and the central line passes through the centers of opposite two lines of the common square cell, and part of the pair of signal traces is located in the common square cell; the pair of signal traces is laid on opposite sides of the central line; opposite edges of the common square cell is two common grid lines which are parallel to the pair of signal traces, and the pair of signal traces are closer to the two common grid lines than other grid lines.

5. A printed circuit board, comprising:
   a ground layer comprising a grid formed by grid lines; and
   a signal layer comprising a pair of signal traces laid on the signal layer, the pair of signal traces are adjacent to a plurality of grid lines, and influence of the plurality of grid lines being uniform along the length of the pair of signal traces when the signal traces transmit signal;
   wherein the grid has a plurality of triangular cells, the pair of signal traces is symmetrical about a grid line, and each signal trace of the pair of signal traces is closer to the grid line than other grid lines.

* * * * *